United States Patent [19]

Rhodes

[11] 3,906,429

[45] Sept. 16, 1975

[54] POTENTIOMETER WIPER ASSEMBLY

[75] Inventor: Robert H. Rhodes, Franklin Park, Ill.

[73] Assignee: Zenith Radio Corporation, Chicago, Ill.

[22] Filed: Aug. 2, 1974

[21] Appl. No.: 494,113

[52] U.S. Cl. ................ 338/202; 29/610; 200/11 G; 338/171

[51] Int. Cl.² ...................... H01C 1/12; H01C 10/32

[58] Field of Search ........... 338/162, 163, 166, 171, 338/174, 184, 197, 202, 315; 200/11 DA, 11 G, 283, 292; 29/610, 622

*Primary Examiner*—Laramie E. Askin
*Attorney, Agent, or Firm*—Nicholas A. Camasto

[57] ABSTRACT

A potentiometer wiper assembly includes a housing with mounting means defining a plane and a rotatable resilient wiper carrying contacts extending below the plane. A stop in the housing contacts a flange on the wiper for limiting its arcuate travel. The wiper may be deflected into the housing and rotated to position the flange in overlying relationship with the stop. In this position the wiper contacts are above the plane, enabling the housing to be bonded to a substrate.

7 Claims, 5 Drawing Figures

POTENTIOMETER WIPER ASSEMBLY

RELATED PATENT APPLICATIONS

This application claims apparatus disclosed in copending application Ser. No. 494,449, filed 8–5–74, entitled "ABRUPT JUNCTION VARACTOR DIODE TELEVISION TUNER" and Ser. No. 502,482, filed 9–3–74, entitled "TELEVISION TUNING SYSTEM WITH PRECISION SUBSTRATE SWITCH ASSEMBLY", both in the name of John Ma and assigned to Zenith Radio Corporation.

BACKGROUND OF THE INVENTION

This invention relates to potentiometers and in particular to a potentiometer in thick film componentry as distinct from discrete circuit elements.

The copending related applications above disclose a switch assembly comprising an alumina substrate, having a plurality of deposited resistors in a precision voltage divider configuration, for a television tuner including abrupt junction type varactor diodes. There is further disclosed four potentiometer wiper assemblies cooperating with potentiometer resistance elements formed on the substrate for setting the end point tuning voltages of the divider networks. These potentiometers thus consist of the resistance element formed on the substrate and a housing, carrying a rotatable wiper, attached to the substrate. The wiper and housing are adapted to cooperatively position the contacts within the housing to allow bonding of the housing to a surface without the need for mounting tabs or loading to offset the resiliency of the wiper.

The advantages of such potentiometer wiper assemblies are self-evident. The potentiometer resistance elements may be conveniently screened on the substrate along with other resistive and conductive elements. The housing may be surface bonded to the substrate by "reflow" soldering to metallized mounting areas formed on the substrate. No mounting tabs and corresponding substrate holes are required. The potentiometer wiper assembly is easily manufacturable, may be automatically handled and placed by machine and in accordance with the teachings of this invention may be readily mounted on the substrate.

As alluded to, the potentiometer wiper contact exerts pressure against the potentiometer resistance element to maintain mechanical and electrical contact therebetween. Prior to the invention, the housing of the potentiometer was attached to the substrate by means of tabs on the housing cooperating with mounting holes in the substrate to maintain the wiper contact in pressure engagement with the resistance element. The housing was forced against the substrate (thereby tensioning the wiper) with the mounting tabs extending through the substrate and the tabs bent over to retain the assembly.

SUMMARY OF THE INVENTION

In accordance with the teachings of the invention, the potentiometer wiper assembly housing may be bonded to a substrate without requiring any external loading on the wiper contact. A flange on the wiper cooperates with a stop in the housing for both limiting wiper travel by engagement with the flange during normal operation and serving as a support for the wiper flange during assembly. Prior to assembly, the wipers are manually forced into the housing, and the wiper assembly control shaft rotated to bring the flange to rest on the stop. In this position the wiper contacts are above the housing base line and the housing may be placed on the substrate and soldered or otherwise bonded thereto. After bonding, rotation of the control shaft forces the flange off of the stop and the wiper contacts are placed into pressure engagement with the resistance element. Thereafter, the stop functions normally to limit travel of the wiper contacts.

OBJECTS OF THE INVENTION

Accordingly, an object of this invention is to provide an improved potentiometer wiper assembly.

A further object of this invention is to provide a novel potentiometer wiper assembly for use with a substrate mounted resistance element.

BRIEF DESCRIPTION OF THE DRAWING

These and other objects of the invention will become apparent upon reading the following description in conjunction with the accompanying drawings in which.

DESCRIPTION OF THE PREFERRED EMBODIMENT

Figures 1, 2, 3:
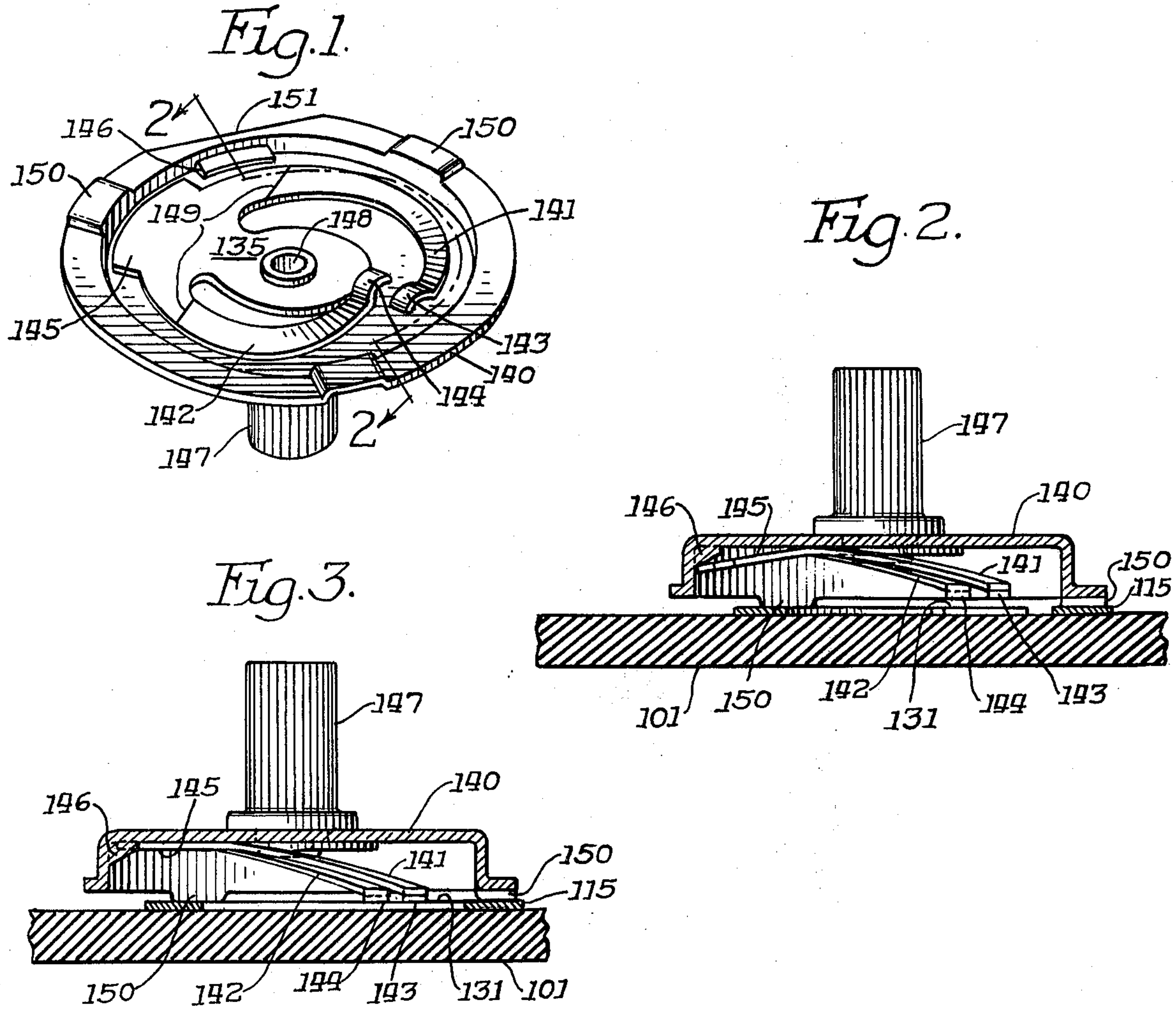
FIG. 1 is an underside perspective view of the potentiometer wiper assembly of the invention.
FIG. 2 is an upright side elevation of the wiper assembly of FIG. 1 taken along the partially arcuate section line 2—2, showing the assembly in mounting position on a substrate.
FIG. 3 is a view similar to that of FIG. 2 showing the wiper assembly in operating position on a substrate.

Referring to FIG. 1, the potentiometer wiper assembly includes a conductive housing 140 and a resilient metallic wiper 135 staked to a control shaft 148 which is mounted for rotatable movement with respect to the housing. A knob 147 is fitted over control shaft 148 by any convenient means. As best shown in FIGS. 2–5, housing 140 includes three mounting feet 150 for cooperation with a like number of soldering pads 115 on a substrate 101. While not specifically shown, the feet (and corresponding soldering pads) may be non-uniformly spaced to provide a simple arrangement for assuring proper orientation of the housing on the substrate. As shown, housing 140 includes a flat portion 151 which is used to assist in properly orientating the housing on the substrate.

Wiper 135 includes a flange or projection 145 and a pair of arm members 141 and 142 extending in generally helical paths about control shaft 148. Arm member 141 terminates in a contact 143 and arm member 142 terminates in a contact 144. The provision of split contacts for moving over a resistance element is a standard practice and, of course, the contacts themselves need not be integral with the arms. A stop 146 in the form of an abutment in the housing is provided for limiting the rotary travel of wiper 135. Arms 141 and 142 are deflected from the plane of the main body of wiper 135 at bend lines 149 and, as may be determined by close inspection of FIG. 1, contacts 143 and 144 extend outside of the confines of housing 140 as defined by the plane formed by the surfaces of its three mounting feet 150. This position will be referred to as the first position of the contacts. When the contacts are in the first position, the housing cannot be placed on a flat surface with mounting feet in contact therewith without applying a force to deflect resilient arms 141 and 142 farther into the housing.

FIGS. 2 and 3 represent upright views of the upper portion of the potentiometer wiper assembly of FIG. 1 taken along the combined straight and arcuate section line 2—2. Rotation of knob 147 rotates control shaft 148 and wiper 135 which is attached thereto by, for example, staking. In FIG. 2 a substrate 101 bearing a potentiometer resistance element 131 and mounting pads 115 (only one of which is visible in these figures) is shown in contact with mounting feet 150 on housing 140. Contacts 143 and 144 are seen to occupy a second position, inside the housing and above and out of contact with resistance element 131. In the second position, contacts 143 and 144 exert no force against substrate 101 and housing 140 may be bonded to the substrate by soldering mounting feet 150 to mounting pads 115. With the contacts in this position, the assembly may be handled and placed on the substrate with automated equipment. This of course materially assists in making the substrate type potentiometer cost effective. It will be noted that flat portion 151 may be used with automated handling equipment to align the assembly.

It will be seen that flange 145 overlies stop 146, which forces contacts 143 and 144 into their second position within housing 140. This position is attained by deflecting arms 141 and 142 into housing 140 and rotating wiper 135 to bring flange 145 to a position over stop 146. Upon release of the deflecting force, the resilience of wiper 135 forces flange 145 into engagement with the upper surface of stop 146 and holds contacts 143 and 144 in the second position. Housing 140 is then placed on the substrate with feet 150 over solder pads 115 (and flat 151 properly aligned) and soldered. After soldering, knob 147 is turned slightly to rotate flange 145 off of stop 146 and place the contacts in their normal operating position intermediate the first and second positions. In operating position, contacts 143 and 144 are in pressure engagement with resistance element 131 and flange 145 cooperates with stop 146 to limit travel of the wiper.

Figure 4:
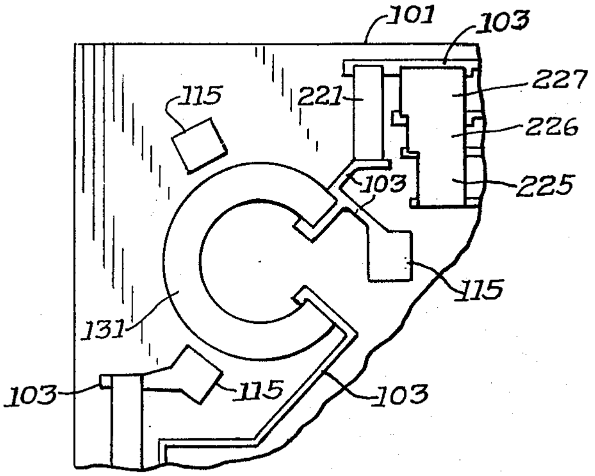
FIG. 4 is a partial view of a substrate, potentiometer resistance element and mounting tabs for cooperation with the wiper assembly of the invention.

In FIG. 4 a portion of substrate 101 is shown. Substrate 101 preferably comprises a base of alumina upon which are screened a plurality of resistive and conductive elements such as resistive elements 221, 225, 226 and 227 and conductive elements 103. There is also a C-shaped potentiometer resistance element 131 with appropriate conductive elements 103 connected to the ends thereof, and the three metallized areas forming solder pads 115 radially disposed outwardly of resistance element 131. Mounting pads 115 serve both the purpose of supporting the housing on the substrate and of making an electrical connection between conductive elements 103 and the wiper (not shown in this figure) of the potentiometer wiper assembly. In practice, solder flux is screened over the mounting tabs prior to placement of the potentiometer wiper assembly. A flux comprising resin and alcohol has proven very effective because it is tacky and holds the housing in position during the reflow soldering operation.

Figure 5:
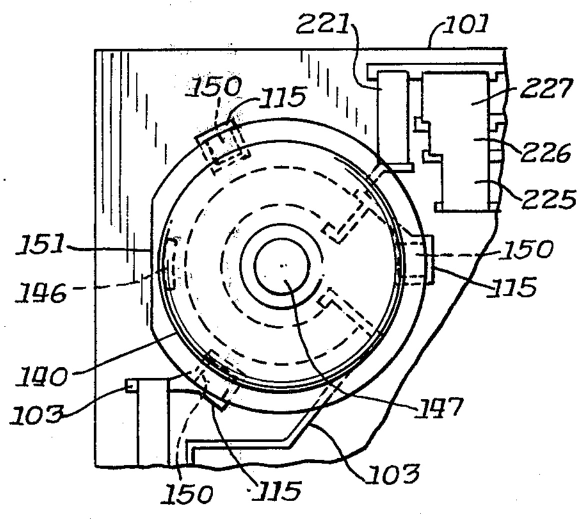
FIG. 5 is a similar view to that of FIG. 4 showing the wiper assembly in position on the substrate.

As indicated in FIG. 5, which shows the potentiometer and wiper assembly in position on substrate 101, housing 140 is positioned with mounting feet 150 resting on corresponding ones of mounting pads 115 and with flat 151 aligned with the lefthand edge of the substrate. In this position, stop 146 limits travel of the wiper to the confines of resistance element 131. It will be appreciated that the potentiometer wiper assembly, with the wiper contacts in their second position as indicated in FIG. 2, is placed on the substrate and the housing soldered to mounting pads 115. Bonding may conveniently be performed during a general reflow soldering operation on the substrate. Thereafter knob 147 is rotated to drive the flange of the wiper off of the stop 146 and place the wiper contacts into their operating position in engagement with resistance element 131.

What has been described is a novel potentiometer wiper assembly which may be easily surface bonded to a substrate bearing a resistance element for cooperation with the wiper in the assembly.

While particular embodiments of the invention have been shown and described, it will be obvious to those skilled in the art that changes and modifications may be made without departing from the invention in its broader aspects, and, therefore, the aim in the appended claims is to cover all such changes and modifications as fall within the true spirit and scope of the invention.

What is claimed is:

1. A potentiometer wiper assembly having a housing adapted for bonding to a substrate and including mounting means defining a plane;

resilient means movably mounted within said housing, said resilient means carrying a contact and normally urging said contact to a first position out of said housing below said plane;

stop means in the path of movement of said resilient means;

said stop means and said resilient means coacting to maintain said contact in a second position, within said housing and above said plane to permit bonding of said mounting means to said substrate; and means connected to said resilient means for releasing said contact to an operative position intermediate said first and second positions after bonding to said substrate.

2. A potentiometer wiper assembly as set forth in claim 1, wherein said stop means comprises an abutment in said housing and said resilient means has a projection for contacting said stop means and limiting travel of said resilient means;

said projection adapted to be moved to a position overlying said abutment to raise said contact to said second position above said plane.

3. A potentiometer wiper assembly as set forth in claim 2, further including a control shaft coupled to said resilient means.

4. A potentiometer wiper assembly as set forth in claim 3, wherein said resilient means is rotatable within said housing;

rotation of said resilient means in cooperation with pivoting of said projection enabling attainment of said second position; and wherein rotation of said resilient means releases said contact to assume said intermediate position after bonding.

5. A potentiometer wiper assembly as set forth in claim 4, wherein said housing is fabricated of conductive material and said contact is electrically connected to said housing.

6. A potentiometer wiper assembly as set forth in claim 5, wherein said mounting means comprise deformations in said housing at a plurality of circumferentially displaced points.

7. A potentiometer wiper assembly as set forth in claim 6, wherein said projection and said contact comprise opposed portions of said resilient means.

* * * * *